United States Patent
Tanaka (10) Patent No.: US 9,054,654 B2
(45) Date of Patent: Jun. 9, 2015

(54) DIFFERENTIAL AMPLIFIER CIRCUIT HAVING PLURAL CURRENT MIRROR CIRCUITS

(71) Applicant: PS4 Luxco S.a.r.l., Luxembourg (LU)

(72) Inventor: Hitoshi Tanaka, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 50 days.

(21) Appl. No.: 13/891,630

(22) Filed: May 10, 2013

(65) Prior Publication Data
US 2013/0307622 A1 Nov. 21, 2013

(30) Foreign Application Priority Data

May 15, 2012 (JP) ................. 2012-111604

(51) Int. Cl.
*H03F 3/45* (2006.01)
*G11C 7/06* (2006.01)
*G05F 1/575* (2006.01)

(52) U.S. Cl.
CPC ............ *H03F 3/45076* (2013.01); *G05F 1/575* (2013.01); *G11C 7/062* (2013.01); *H03F 3/45183* (2013.01); *H03F 3/45192* (2013.01); *H03F 2200/456* (2013.01); *H03F 2203/45124* (2013.01)

(58) Field of Classification Search
CPC ........................................... H03F 3/45

USPC ........................................... 330/357, 253, 255
See application file for complete search history.

(56) References Cited

U.S. PATENT DOCUMENTS

| | | | | |
|---|---|---|---|---|
| 5,157,322 A * | 10/1992 | Llewellyn | ...................... | 323/315 |
| 6,714,079 B2 * | 3/2004 | Dessard et al. | ............... | 330/256 |
| 7,586,373 B2 * | 9/2009 | Kim | .............................. | 330/257 |
| 7,592,869 B2 * | 9/2009 | Bae et al. | ...................... | 330/254 |
| 2002/0140504 A1 * | 10/2002 | Hasegawa | ....................... | 330/57 |
| 2002/0175716 A1 * | 11/2002 | Cyrusian | ..................... | 327/108 |

FOREIGN PATENT DOCUMENTS

JP 2005-208692 8/2005

OTHER PUBLICATIONS

Itoh, K. et al. (2008). *Ultra-Low Voltage Nano-Scale Memories*. Springer: NY, pp. 238-239, pp. 253-261.

* cited by examiner

*Primary Examiner* — Patricia Nguyen (57) ABSTRACT

Disclosed herein is a differential amplifier circuit that includes: first and second transistors coupled to form a differential circuit; a first current mirror circuit generating first and second currents in response to a third current flowing through the first transistor; and a second current mirror circuit generating a fourth current in response to a fifth input current. A sum of the second and fourth currents flowing through the second transistor.

15 Claims, 12 Drawing Sheets

| MOS Tr. | Transconductance | Drain resistance |
|---|---|---|
| M1 | $kg_{mp1}$ | – |
| M2 | $(1-k)g_{mp1}$ | – |
| M3 | $g_{mp1}$ | – |
| M4 | $g_{mn1}$ | – |
| M5 | $g_{mn1}$ | – |
| M6 | – | – |
| M7 | $g_{mp1}$ | – |
| M8 | $g_{mp1}$ | $r_{dp1}$ |
| M9 | $g_{mn2}$ | – |
| M9' | $g_{mn2}$ | – |
| M10 | $g_{mn2}$ | $r_{dn2}$ |
| M10' | $g_{mn2}$ | $r_{dn2}$ |
| M11 | $g_{mp2}$ | $r_{dp2}$ |
| M12 | – | – |

DIFFERENTIAL AMPLIFIER CIRCUIT HAVING PLURAL CURRENT MIRROR CIRCUITS

BACKGROUND OF THE INVENTION

1. Field of the Invention

The present invention relates to a differential amplifier circuit and a semiconductor device including the same, and more particularly to a differential amplifier circuit that is suitably used to an internal voltage generation circuit, and a semiconductor device including the same.

2. Description of Related Art

In many semiconductor devices, an internal voltage generation circuit that generates an internal voltage based on an external voltage is provided. What is known as the internal voltage generation circuit is of a type that uses a differential amplifier circuit, as disclosed in Japanese Patent Application Laid-Open No. 2005-208692 and K. Itoh, M. Horiguchi, H. Tanaka, Ultra-Low Voltage Nano-Scale memories, New York: Springer, 2008, (pp amp.: pp. 238-239, p-z comp.: pp. 253-261).

Figure 12:
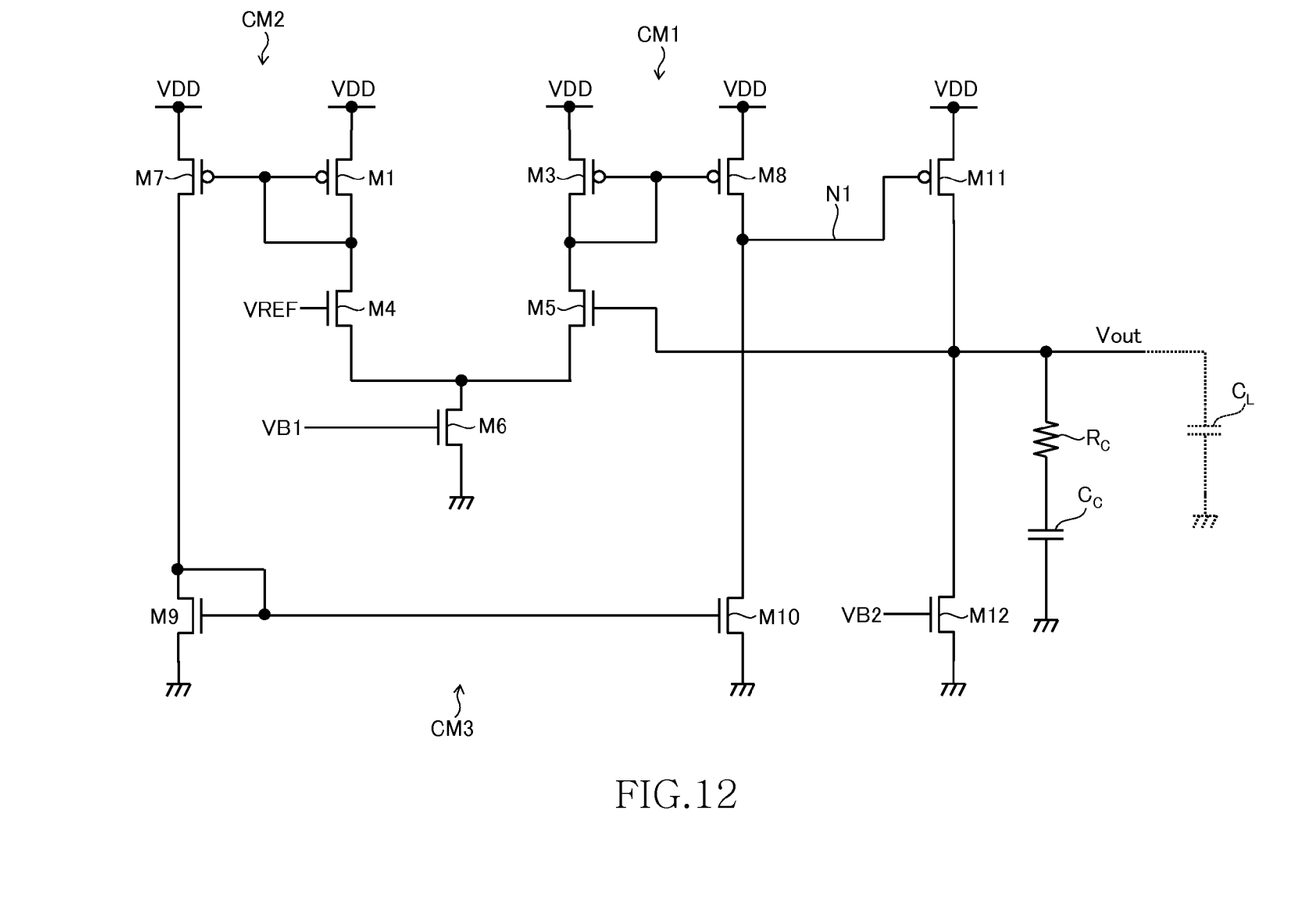
FIG. 12 is a circuit diagram of a conventional differential amplifier circuit.

FIG. 12 is a circuit diagram of a conventional differential amplifier circuit disclosed in K. Itoh, M. Horiguchi, H. Tanaka, Ultra-Low Voltage Nano-Scale memories.

A differential amplifier circuit shown in FIG. 12 includes transistors M4 and M5 connected into a differential form and a transistor M6 connected in common to the transistors M4 and M5. The gate electrode of the transistor M4 is supplied with a reference voltage VREF. The gate electrode of the transistor M5 is supplied with an output voltage Vout. The gate of the transistor M6 is supplied with a bias voltage VB1.

A current flowing through the transistor M4 is supplied into a current mirror circuit CM2 that includes transistors M1 and M7. An output current thereof is supplied into a current mirror circuit CM3 that includes transistors M9 and M10. Meanwhile, a current flowing through the transistor M5 is supplied into a current mirror circuit CM1 that includes transistors M3 and M8. As shown in FIG. 12, the transistors M8 and M10 that constitute output transistors of the current mirror circuits CM1 and CM3 are connected in series. As a result, a difference current between an output current flowing through the transistor M8 and an output current flowing through the transistor M10 flows through an output node N1. The output node N1 is connected to the gate electrode of a driver transistor M11. Accordingly, the conduction state of the driver transistor M11 is so controlled that the level of the output voltage Vout becomes equal to the reference voltage VREF.

However, according to a study by the present inventor, the response speed of the differential amplifier circuit shown in FIG. 12 is not enough. Moreover, the voltage gain is relatively low. Therefore, there is obviously the problem that an output voltage error is large. In order to increase the response speed, the current ratio of the current mirror circuits CM1 and CM2 should be so designed as to be 1: k, where k<1. However, in this case, the output current of the current mirror circuits CM1 and CM2 becomes 1/k times larger, resulting in an increase in power consumption. Even if the current ratio of the current mirror circuits CM1 and CM2 is 1:k, the voltage gain remains unchanged, meaning that the output voltage error is not reduced. Therefore, what is desired is a differential amplifier circuit that has a fast response speed and a smaller output voltage error.

SUMMARY

In one embodiment, there is provided a device that includes first and second input terminals, first and second power-supply terminals, a first current path and a second current path. The first current path includes: a first node; a first transistor coupled between the first power-supply terminal and the first node and having a control electrode coupled to the first node; and a second transistor coupled between the second power-supply terminal and the first node and having a control electrode coupled to the first input terminal. The second current path includes: a second node; a third transistor coupled between the first power-supply terminal and the second node and having a control electrode coupled to the second node; a fourth transistor coupled between the second power-supply terminal and the second node and having a control electrode coupled to the second input terminal; and a fifth transistor coupled between the first power-supply terminal and the second node and having a control electrode coupled to the first node.

In another embodiment, there is provided a device that includes: first and second transistors coupled to form a differential circuit; a first current mirror circuit generating first and second currents in response to a third current flowing through the first transistor; and a second current mirror circuit generating a fourth current in response to a fifth input current. A sum of the second and fourth currents flowing through the second transistor.

DETAILED DESCRIPTION OF THE EMBODIMENTS

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessarily mutually exclusive, as some disclosed embodiments can be combined with one or more other disclosed embodiments to form new embodiments.

Figure 1:
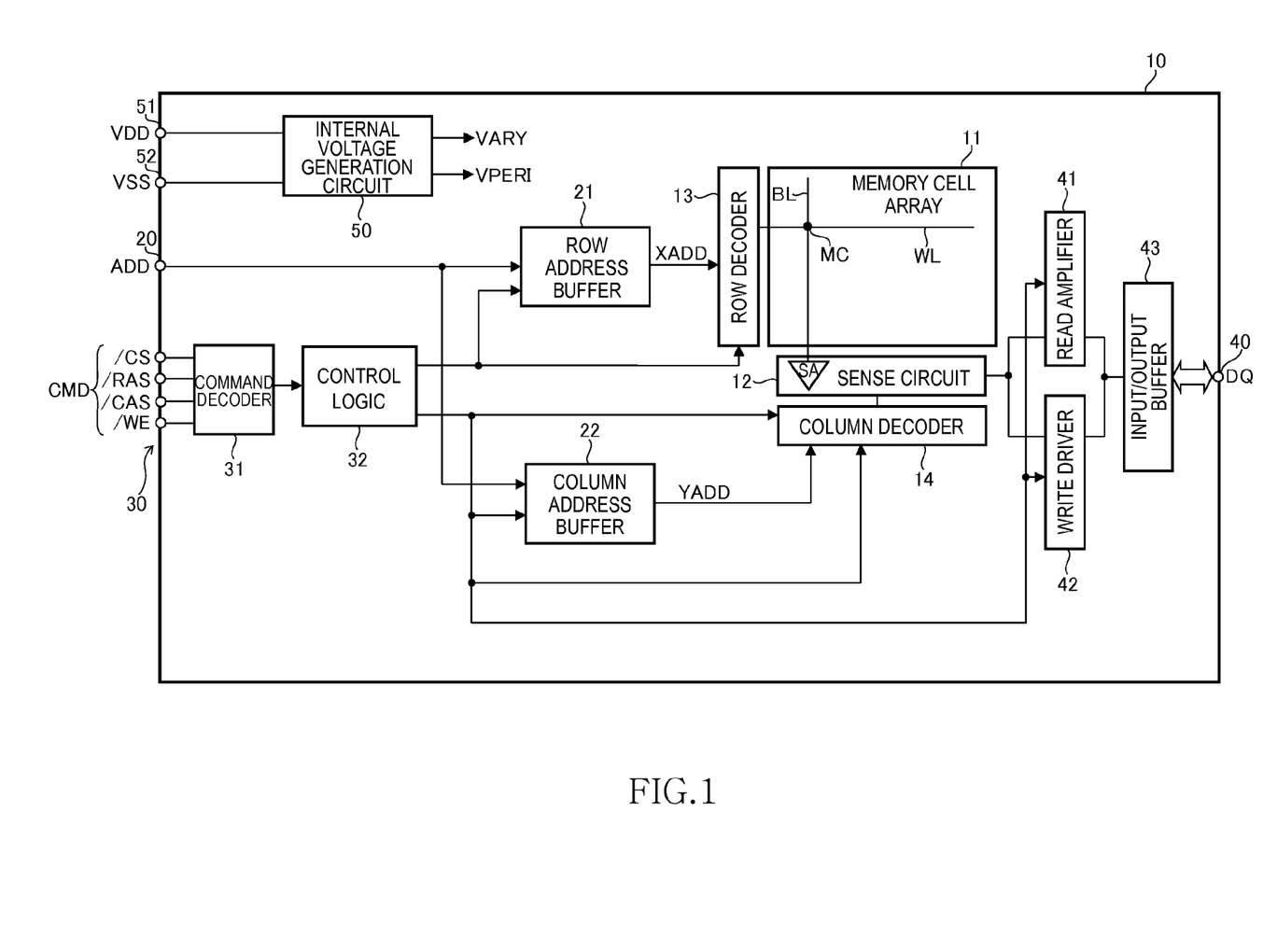
FIG. 1 is a block diagram showing a configuration of a semiconductor device according to an embodiment of the present invention.

Referring now to FIG. 1, the semiconductor device 10 according to an embodiment of the present invention is DRAM (Dynamic Random Access Memory), and is integrated on a single semiconductor chip. However, the semiconductor device according to the present invention is not limited to DRAM. The semiconductor device according to the present invention may be other kinds of semiconductor memory devices, such as SRAM (Static Random Access Memory), PRAM (Phase change Random Access Memory), ReRAM (Resistance Random Access Memory), and flash memory, or logic semiconductor devices.

As shown in FIG. 1, the semiconductor device 10 includes a memory cell array 11. The memory cell array 11 includes a plurality of word lines WL, a plurality of bit lines BL, and a plurality of memory cells MC disposed at intersections of the above lines. Each bit line BL is connected to one of sense amplifiers SA included in a sense circuit 12. The word lines WL are selected by a row decoder 13. The bit lines BL are selected by a column decoder 14. The row decoder 13 selects one of the word lines WL based on a row address XADD that is supplied via a row address buffer 21. The column decoder 14 selects one of the bit lines BL based on a column address YADD that is supplied via a column address buffer 22. To the row address buffer 21 and the column address buffer 22, an address signal ADD is supplied from outside via an address terminal 20.

The semiconductor device 10 further includes command terminals 30. The command terminals 30 are supplied with command signal CMD constituted of a chip select signal /CS, a row address strobe signal /RAS, a column address strobe signal /CAS, and a write enable signal /WE. The command signal CMD is decoded by a command decoder 31 before being supplied to a control logic 32. The control logic 32 generates various internal commands based on the results of decoding by the command decoder 31. An operation of each of functional blocks included in the semiconductor device 10 is controlled by the internal commands.

More specifically, when a command signal CMD indicates row access, an address signal ADD is supplied to the row address buffer 21. The row address buffer 21 then outputs the address signal ADD to the row decoder 13 as a row address XADD. As a result, one of the word lines WL is selected in the memory cell array 11. When a command signal CMD indicates column access, an address signal ADD is supplied to the column address buffer 22. The column address buffer 22 then outputs the address signal ADD to the column decoder 14 as a column address YADD. As a result, during a read operation, read data DQ that are read from a memory cell MC are output from a data terminal 40 via a read amplifier 41 and an input/output buffer 43. During a write operation, write data DQ that are input into the data terminal 40 are written into a memory cell MC via the input/output buffer 43 and a write driver 42.

Furthermore, the semiconductor device 10 includes an internal voltage generation circuit 50. The internal voltage generation circuit 50 generates various internal voltages based on a power-supply potential VDD and a ground potential VSS that are supplied from outside via power-supply terminals 51 and 52. According to the present embodiment, the internal voltage generation circuit 50 generates at least internal voltages VARY and VPERI. The internal voltage VARY is a voltage that is mainly used in the sense circuit 12. One of the bit lines BL that are paired and connected to a sense amplifier SA is driven to the internal voltage VARY. The internal voltage VPERI is a voltage that is used as an operating voltage in many other functional blocks, such as the row decoder 13, the column decoder 14, the row address buffer 21, the column address buffer 22, the command decoder 31, the control logic 32, the read amplifier 41, and the write driver 42.

Although not specifically limited, according to the present embodiment:

$$VDD > VPERI > VARY > VSS$$

In one example, VDD=1.1V, VPERI=1.0V, VARY=0.8V, and VSS=0V.

Figure 2:
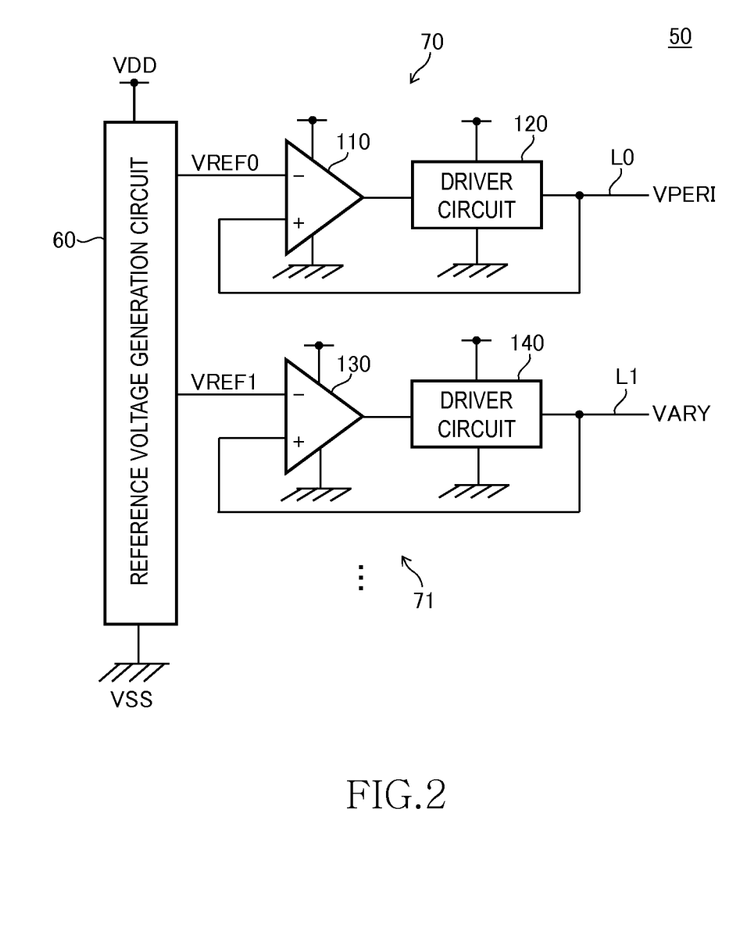
FIG. 2 is a block diagram showing a configuration of the internal voltage generation circuit shown in FIG. 1.

Turning to FIG. 2, the internal voltage generation circuit 50 includes a reference voltage generation circuit 60 and differential amplifier circuits 70 and 71. The reference voltage generation circuit 60 generates reference voltages VREF0 and VREF1. The reference voltages VREF0 and VREF1 are equal to target values of the internal voltages VPERI and VARY, respectively. The differential amplifier circuit 70 includes a comparator 110 and a driver circuit 120. The differential amplifier circuit 71 includes a comparator 130 and a driver circuit 140.

The comparator 110 compares the reference voltage VREF0 and the internal voltage VPERI. An output signal of the comparator 110 is supplied to the driver circuit 120. The driver circuit 120 drives a power-supply line L0 based on an output signal from the comparator 110 in such a way that the internal voltage VPERI on the power-supply line L0 becomes equal to a level of the reference voltage VREF0. Similarly, the comparator 130 compares the reference voltage VREF1 and the internal voltage VARY. An output signal of the comparator 130 is supplied to the driver circuit 140. The driver circuit 140 drives a power-supply line L1 based on an output signal from the comparator 130 in such a way that the internal voltage VARY on the power-supply line L1 becomes equal to a level of the reference voltage VREF1.

As described above, according to the present embodiment, the levels of the internal voltages VPERI and VARY are less than VDD. The value of the internal voltage VPERI is closer to the VDD level than the value of the internal voltage VARY. Therefore, if the circuit configuration of the comparator 110 is the same as that of the comparator 130, the drive capability of the internal voltage VPERI may not be enough. Furthermore, while the internal voltage VARY is mainly used in the sense circuit 12, the internal voltage VPERI is used in many functional circuit blocks. Therefore, a load on the internal voltage VPERI is greater than that on the internal voltage VARY. As a result, the internal voltage VPERI is required to be higher in responsiveness to voltage fluctuations. Given the above points, according to the present embodiment, the circuit configurations of the differential amplifier circuits 70 and 71 are optimized. Hereinafter, the specific circuit configurations of the differential amplifier circuits 70 and 71 will be described with reference to FIGS. 3 and 4.

Figure 3:
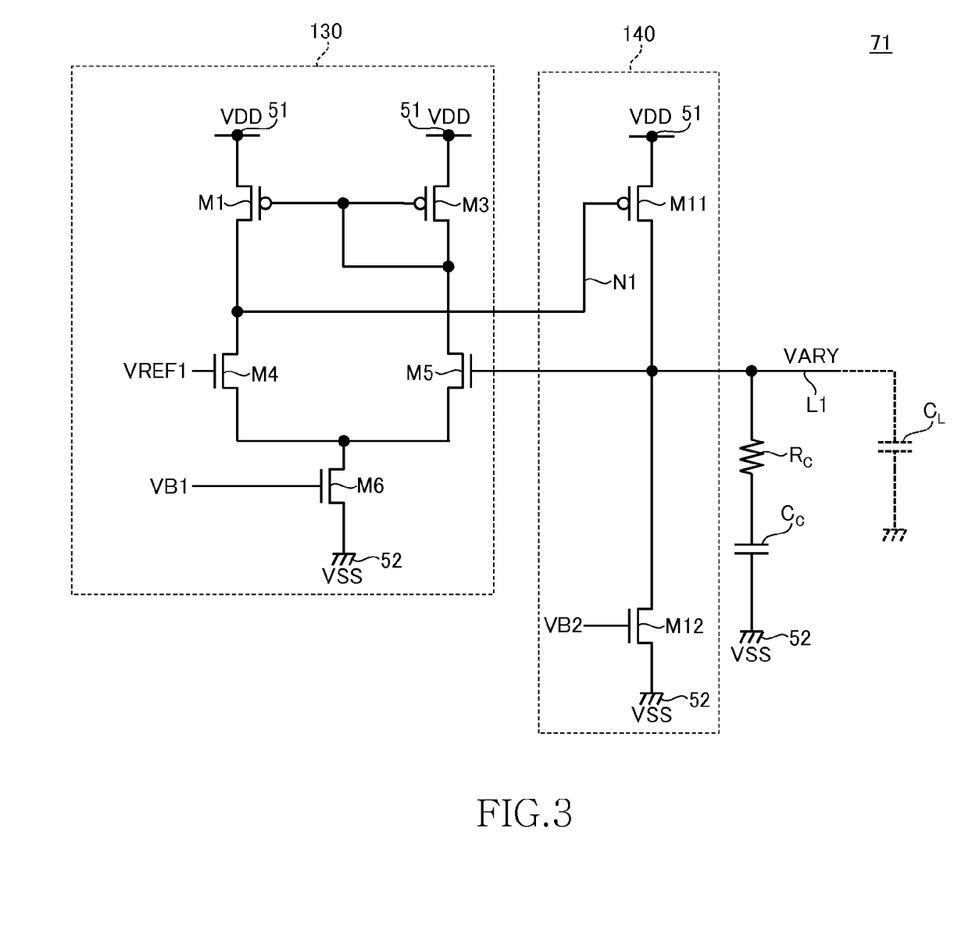
FIG. 3 is a circuit diagram of the differential amplifier circuit shown in FIG. 2.

As shown in FIG. 3, the comparator 130 included in the differential amplifier circuit 71 includes P-channel MOS transistors M1 and M3 and N-channel MOS transistors M4, M5 and M6. The sources of the transistors M1 and M3 are connected to a power-supply terminal 51 supplied with a power-supply potential VDD. The drains of the transistors M1 and M3 are connected to the drains of the transistors M4 and M5, respectively. The gate electrodes of the transistors M1 and M3 are connected in common to the drain of the transistor M3 so as to form a current mirror circuit. The sources of the transistors M4 and M5 are connected in common to the drain of the transistor M6. The source of the transistor M6 is connected to a power-supply terminal 52 supplied with a power-supply potential VSS. The gate electrode of the transistor M6 is supplied with a bias potential VB1 so that the transistor M6 functions as a constant current source. The gate electrodes of the transistors M4 and M5 are respectively supplied with the reference voltage VREF1 and the internal voltage VARY.

In the above configuration, the comparator 130 compares the level of the reference voltage VREF1 with the level of the internal voltage VARY. A difference current of the transistors M1 and M4, which is generated by a potential difference thereof, flows into an output node N1.

The output node N1 is connected to the gate electrode of a P-channel MOS transistor M11 that is a part of the driver circuit 140. The transistor M11 is a driver transistor that drives the power-supply line L1 to the internal voltage VARY. The source of the transistor M11 is connected to the power-supply terminal 51 supplied with the power-supply potential VDD. The drain of the transistor M11 is connected to the power-supply line L1. The driver circuit 140 further includes a N-channel MOS transistor M12 that is connected between the power-supply line L1 and the power-supply terminal 52. To the gate electrode of the N-channel MOS transistor M12, a bias potential VB2 is supplied. As a result, the transistor M12 functions as a constant current source.

In the above configuration, as the level of the internal voltage VARY drops below the level of the reference voltage VREF1, a current flows from the driver circuit 140 to the comparator 130 via the output node N1, resulting in an increase in the voltage between the gate and source of the driver transistor M11. As a result, the level of the internal voltage VARY rises. On the other hand, as the level of the internal voltage VARY rises above the level of the reference voltage VREF1, a current flows from the comparator 130 to the driver circuit 140 via the output node N1, resulting in a decrease in the voltage between the gate and source of the driver transistor M11. As a result, the level of the internal voltage VARY declines. The above control process stabilizes the level of the internal voltage VARY, which therefore becomes equal to the level of the reference voltage VREF1.

In this case, capacitance $C_L$ shown in FIG. 3 is load capacitance of the power-supply line L1; resistance $R_C$ and capacitance $C_C$ are a phase compensation circuit of a pole-zero type. The pole-zero type phase compensation circuit is designed to cancel a pole created by the drain resistance of the transistors M1 and M4 and the capacitance between the gate and source of the driver transistor M11 at a zero point of the resistance $R_C$ and capacitance $C_C$.

As described above, according to the present embodiment, VDD=1.1 V and VARY=0.8 V. Therefore, the amount of voltage drop of the internal voltage VARY is 0.3 V. Meanwhile, according to the present embodiment, VPERI=1.0 V. Therefore, the amount of voltage drop of the internal voltage VPERI is only 0.1 V. Accordingly, if the circuit configuration of the differential amplifier circuit 70 is the same as the circuit configuration of the differential amplifier circuit 71 shown in FIG. 3, the current supply capability of the driver circuit 120 may not be sufficient. The reason is that, since the source potential of the transistors M4 and M5 is fixed to VREF1−Vt (Vt is a threshold voltage of the transistors M4 and M5) in the differential amplifier circuit 71 shown in FIG. 3, the potential of the output node N1 does not become less than VREF1−Vt, and the gate-to-source voltage of the driver transistor M11 does not exceed VDD-VREF1+Vt as a result.

The above problem may be solved by using a conventional differential amplifier circuit shown in FIG. 12. The reason is that, because the output node N1 is driven by a push-pull manner in the differential amplifier circuit shown in FIG. 12, the potential of the output node N1 can be changed from VDD to VSS in amplitude. However, the differential amplifier circuit shown in FIG. 12 has the structure in which the differential-single end conversion circuit that includes the transistors M7 to M10 is added to the differential circuitry portion that includes the transistors M1 and M3 to M6. Therefore, the response speed becomes slower accordingly. Moreover, a relatively large voltage is applied between the drains and sources of the transistors M7, M8, and M10, resulting in a decrease in drain resistance. The problem would arise that the decrease in drain resistance leads to a decrease in gain, causing a larger output voltage error.

As described above, in order to increase the response speed in the differential amplifier circuit shown in FIG. 12, all that is required is to set the current ratio of the current mirror circuits CM1 and CM2 to 1:k, where k<1. However, in this case, the output current of the current mirror circuits CM1 and CM2 becomes 1/k times larger, resulting in an increase in a power consumption. Even if the current ratio of the current mirror circuits CM1 and CM2 is set to 1:k, the voltage gain remains unchanged, meaning that the output voltage error is not reduced. A differential amplifier circuit of a preferred embodiment of the present invention, which will be described below, can solve such a problem, and is characterized by a faster response speed and a smaller output voltage error.

Figure 4:
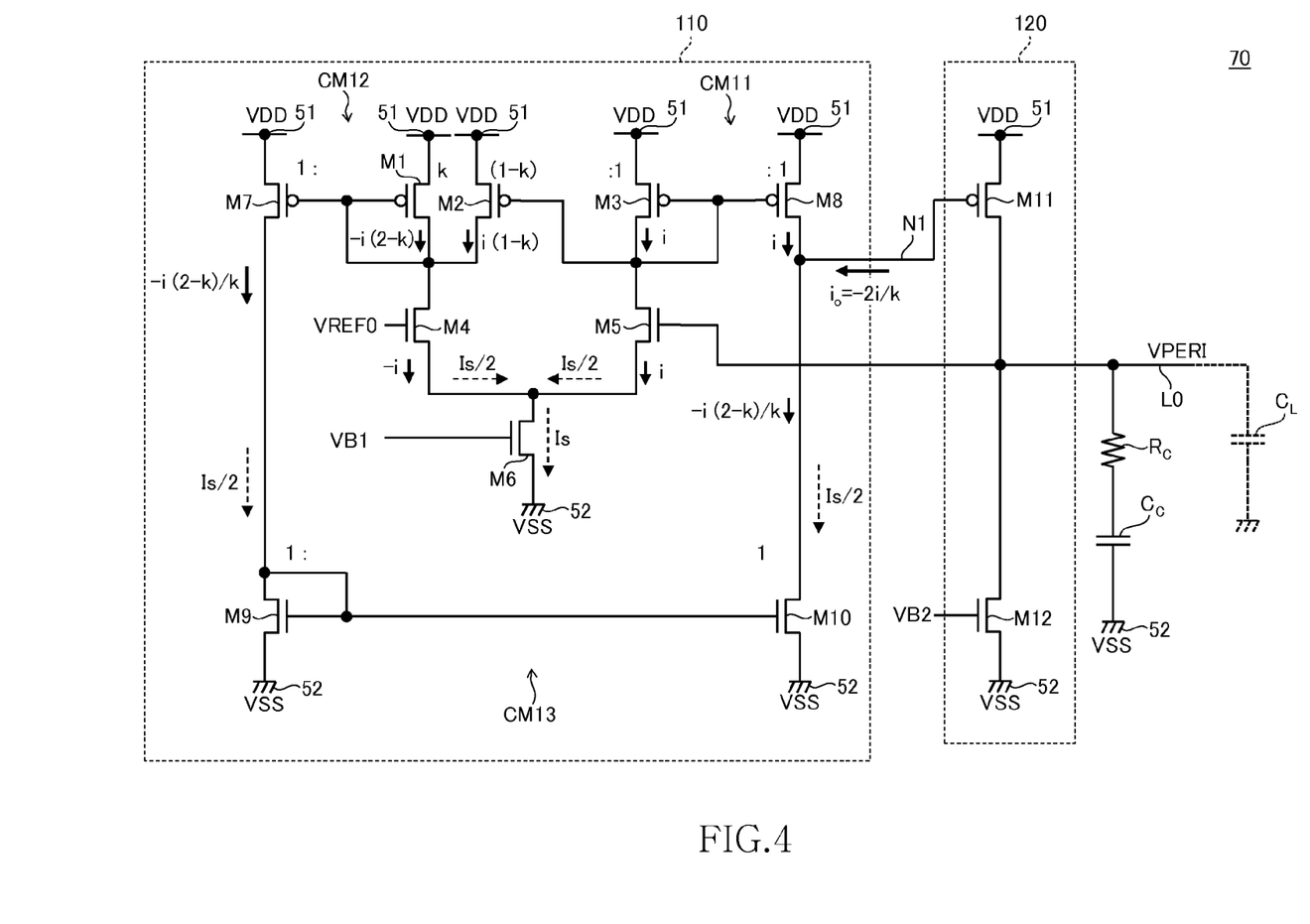
FIG. 4 is a circuit diagram of a differential amplifier circuit shown in FIG. 2 according to a first embodiment of the present invention.

Turning to FIG. 4, a comparator 110 included in the differential amplifier circuit 70 includes N-channel MOS transistors M4 and M5 connected into a differential form; a N-channel MOS transistor M6 that functions as a constant current source; and current mirror circuits CM11, CM12 and CM13. Incidentally, in FIG. 4, the components corresponding those shown in FIGS. 3 and 12 are represented by the same reference symbols. The gate electrodes of the transistors M4 and M5 form a pair of input terminals, and the drains of the transistors M4 and M5 form a pair of nodes.

The current mirror circuit CM11 includes a P-channel MOS transistor M3 on an input side and P-channel MOS transistors M2 and M8 on an output side. The gate electrodes of the transistors M3, M2, and M8 are connected in common to the drain of the transistor M3. The sources of the transistors M3, M2, and M8 are connected to a power-supply terminal 51 supplied with the power-supply potential VDD. In the above configuration, each of the transistors M2 and M8 supplies an output current that is proportional to an input current flowing through the transistor M3. The input current flowing through the transistor M3 is equal to a current flowing through the transistor M5. According to the present embodiment, the size ratio of the transistors M3, M8, and M2 is 1:1:1−k, where k<1.

The current mirror circuit CM12 includes a P-channel MOS transistor M1 on an input side and a P-channel MOS transistor M7 on an output side. The gate electrodes of the transistors M1 and M7 are connected in common to the drain of the transistor M1. The sources of the transistors M1 and M7 are connected to the power-supply terminal 51. In the above configuration, the transistor M7 supplies an output current that is proportional to an input current flowing through the transistor M1. To the drain of the transistor M1, the drain of the transistor M2 that is apart of the current mirror circuit CM11, is connected. Accordingly, the sum of the input current flowing through the transistor M1 and the output current flowing through the transistor M2 flows through the transistor M4. According to the present embodiment, the size ratio of the transistors M1 and M7 is k:1.

The current mirror circuit CM13 includes a N-channel MOS transistor M9 on an input side and a N-channel MOS transistor M10 on an output side. The gate electrodes of the transistors M9 and M10 are connected in common to the drain of the transistor M9. The sources of the transistors M9 and M10 are connected to a power-supply terminal 52 supplied with a ground potential VSS. In the above configuration, the transistor M10 supplies an output current that is proportional to an input current flowing through the transistor M9. The input current flowing through the transistor M9 is supplied from the transistor M7 that is a part of the current mirror circuit CM12. According to the present embodiment, the size ratio of the transistors M9 and M10 is 1:1.

As shown in FIG. 4, the transistors M8 and M10 that are parts of the current mirror circuits CM11 and CM13 are connected in series between the power-supply terminals 51 and 52. Therefore, if there is a difference between the output current flowing through the transistor M8 and the output current flowing through the transistor M10, the difference current $i_o$ flows through the output node N1. The configuration of the driver circuit 120 is the same as that of the driver circuit 140 shown in FIG. 3. The output node N1 is connected to the gate electrode of the driver transistor M11.

The following describes an operation of the differential amplifier circuit 70 shown in FIG. 4.

As the level of the internal voltage VPERI is changed by $v_i$ relative to the reference voltage VREF0, the current flowing through the transistor M5 is changed by i. If the transconductance of the transistor M5 is $g_{mn1}$:

$$i = g_{mn1} v_i$$

The current change i is input into the current mirror circuit CM11, and appears as a change in the output current thereof. In this case, the size ratio of the transistors M3 and M8, which are parts of the current mirror circuit CM11, is 1:1. The size ratio of the transistors M3 and M2 is 1:1−k. Therefore, the change in the output current flowing through the transistor M8 is i. The change in the output current flowing through the transistor M2 is i(1−k).

Meanwhile, as the current flowing through the transistor M5 is changed by i, the current flowing through the transistor M4 is changed by −i. The reason is that the transistor M6 is a constant current source, and the current flowing therethrough is constant at Is. Accordingly, in a steady state, current Is/2 flows through the transistors M5 and M4.

In this case, the transistors M2 and M4 are connected in series. Therefore, if there is a difference between the current flowing through the transistor M2 and the current flowing through the transistor M4, the difference current flows through the transistor M1. In the present example, the current change of the transistor M2 is i(1−k), and the current change of the transistor M4 is −i. Therefore, the difference current, i.e. −i(2−k), flows through the transistor M1 as an input current of the current mirror circuit CM12. The current change −i(2−k) is input into the current mirror circuit CM12, and appears as a change in the output current thereof. In this case, the size ratio of the transistors M1 and M7 that are parts of the current mirror circuit CM12, is k:1. As a result, the change in the output current flowing through the transistor M7 is −i(2−k)/k.

The change in the output current flowing through the transistor M7 is input into the current mirror circuit CM13, and appears as a change in the output current thereof. In this case, the size ratio of the transistors M9 and M10 that are parts of the current mirror circuit CM13, is 1:1. Therefore, the change in the output current flowing through the transistor M10 is also −i(2−k)/k.

The transistors M8 and M10 are connected in series. Therefore, if there is a difference between the current flowing through the transistor M8 and the current flowing through the transistor M10, the difference current $i_o$ flows through the output node N1. In the present example, the current change of the transistor M8 is i, and the current change of the transistor M10 is −i(2−k)/k. Therefore, the difference current $i_o$, i.e. −2i/k, flows through the output node N1.

In this case, in the conventional differential amplifier circuit shown in FIG. 12, if the current ratio of the current mirror circuits CM1 and CM2 is set to 1:1, the difference current $i_o$ flowing through the output node N1 is −2i with respect to the voltage change vi of the internal voltage VPERI. Therefore, according to the present embodiment, the difference current is 1/k times larger than that in the conventional case. As a result, for the voltage change of the internal voltage VPERI, a faster response is possible. Incidentally, even in the differential amplifier circuit shown in FIG. 12, if the current ratio of the current mirror circuits CM1 and CM2 is set to 1:k, the difference current $i_o$ flowing through the output node N1 becomes −2i/k as in the case of the present embodiment. However, in this case, the output current of the current mirror circuits CM1 and CM2 is 1/k times larger, resulting in an increase in current consumption. According to the present embodiment, the ratio of the total size of the transistors M1 and M2 and the size of the transistor M7 is 1:1. Therefore, the power consumption in the present embodiment can be kept at the same level as that in the case where the current ratio of the current mirror circuits CM1 and CM2 is set to 1:1 in the differential amplifier circuit shown in FIG. 12. Moreover, the total transistor size remains unchanged. Therefore, there is no increase in an area occupied on a chip.

Furthermore, in the differential amplifier circuit shown in FIG. 12, even if the current ratio of the current mirror circuits CM1 and CM2 is so designed as to be 1:k, the drain resistance of the transistors M8 and M10 becomes k times larger. As a result, the voltage gain that is defined as the amount of current change multiplied by the drain resistance, remains unchanged compared with the case where the current ratio of the current mirror circuits CM1 and CM2 is 1:1. According to the present embodiment, the drain resistance of the transistors M8 and M10 does not become k times larger. Therefore, the voltage gain can be 1/k times larger. As a result, the output voltage error can be reduced.

The second embodiment of the present invention will be explained next.

Figure 5:
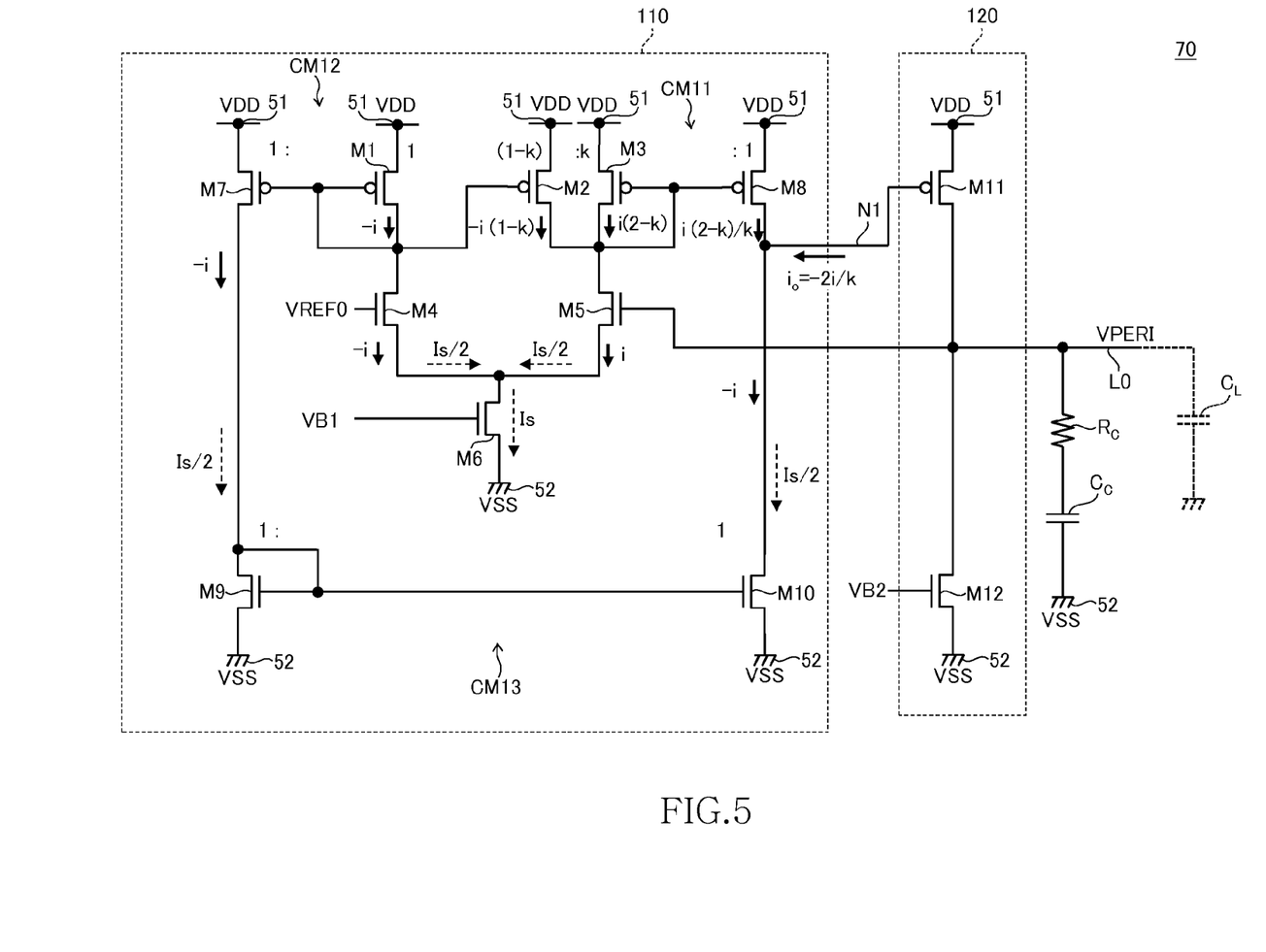
FIG. 5 is a circuit diagram of a differential amplifier circuit shown in FIG. 2 according to a second embodiment of the present invention.

In the differential amplifier circuit 70 shown in FIG. 5, the drain of a transistor M2 is connected to the drain of a transistor M5, and the gate electrode of the transistor M2 is connected to the drain of a transistor M4. According to the present embodiment, the size ratio of transistors M3 and M8, which are parts of a current mirror circuit CM11, is k:1. The size ratio of transistors M1, M2, and M7 that are parts of a current mirror circuit CM12, is 1:1−k:1. The other components are the same as those of the differential amplifier circuit shown in FIG. 4. Therefore, the same elements are represented by the same reference symbols, and a duplicate description will be omitted. According to the present embodiment, the same advantageous effects as those of the differential amplifier circuit shown in FIG. 4 can be achieved.

The third embodiment of the present invention will be explained next.

Figure 6:
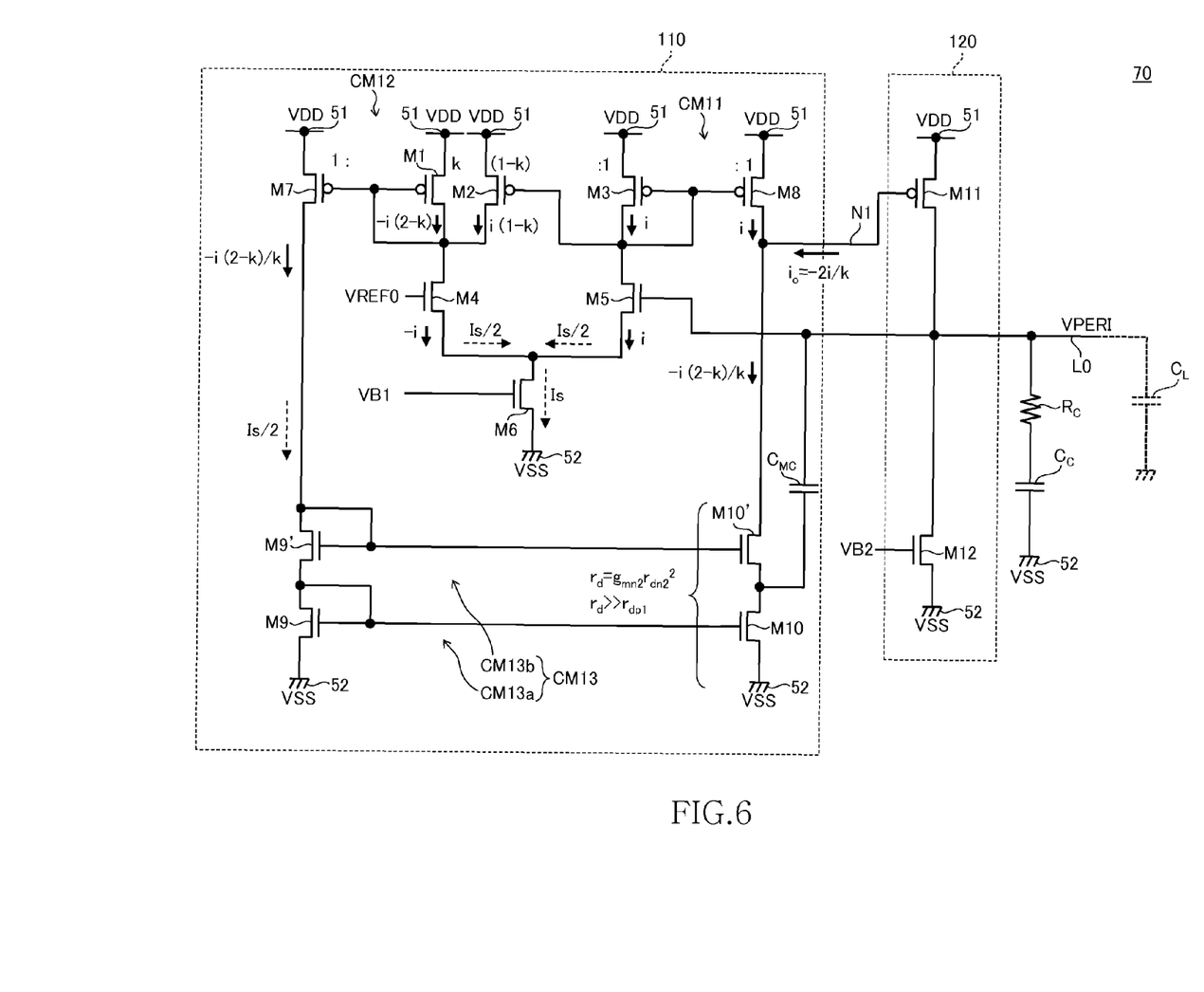
FIG. 6 is a circuit diagram of a differential amplifier circuit shown in FIG. 2 according to a third embodiment of the present invention.

As shown in FIG. 6, in the differential amplifier circuit 70 of the present embodiment, a current mirror circuit CM13 is made up of two current mirror circuits CM13a and CM13b, which are cascode-connected. The current mirror circuit CM13a includes N-channel MOS transistors M9 and M10. The current mirror circuit CM13b includes N-channel MOS transistors M9' and M10'. In the above configuration, the drain resistance of the transistors M10 and M10' becomes higher, resulting in an increase in voltage gain. As a result, the output voltage error can be further reduced.

More specifically, if the transconductance of the transistors M10 and M10' is represented by $g_{mn2}$, and the drain resistance by $r_{dn2}$, the sum $r_d$ of drain resistance of the transistors M10 and M10' is given as follows:

$$r_d = g_{mn2} r_{dn2}^2$$

In this manner, the sum $r_d$ is sufficiently larger than the drain resistance $r_{dp1}$ of the transistor M8. That is, while the output resistance of the differential amplifier is determined based on the parallel connection value of $r_{dp1}$ and $r_{dn2}$ in a conventional case, the output resistance is substantially determined based on only $r_{dp1}$. If the above measure is not enough to gain a sufficient gain, the P-channel MOS transistors M7 and M8, too, may be cascode-connected.

However, according to the present embodiment, an equivalent output resistance of the output node N1 becomes larger. Therefore, a pole that is generated by the equivalent output resistance of the output node N1 and the gate capacitance of the driver transistor M11 is shifted to a low-frequency side. As a result, a feedback loop becomes destabilized. However, according to the present embodiment, between a connection point of the transistors M10 and M10' and the power-supply line L0, phase compensation capacitance $C_{MC}$ is inserted, thereby stabilizing the feedback loop. The other components are the same as those of the differential amplifier circuit shown in FIG. 4. Therefore, the same elements are represented by the same reference symbols, and a duplicate description will be omitted.

Figure 7:
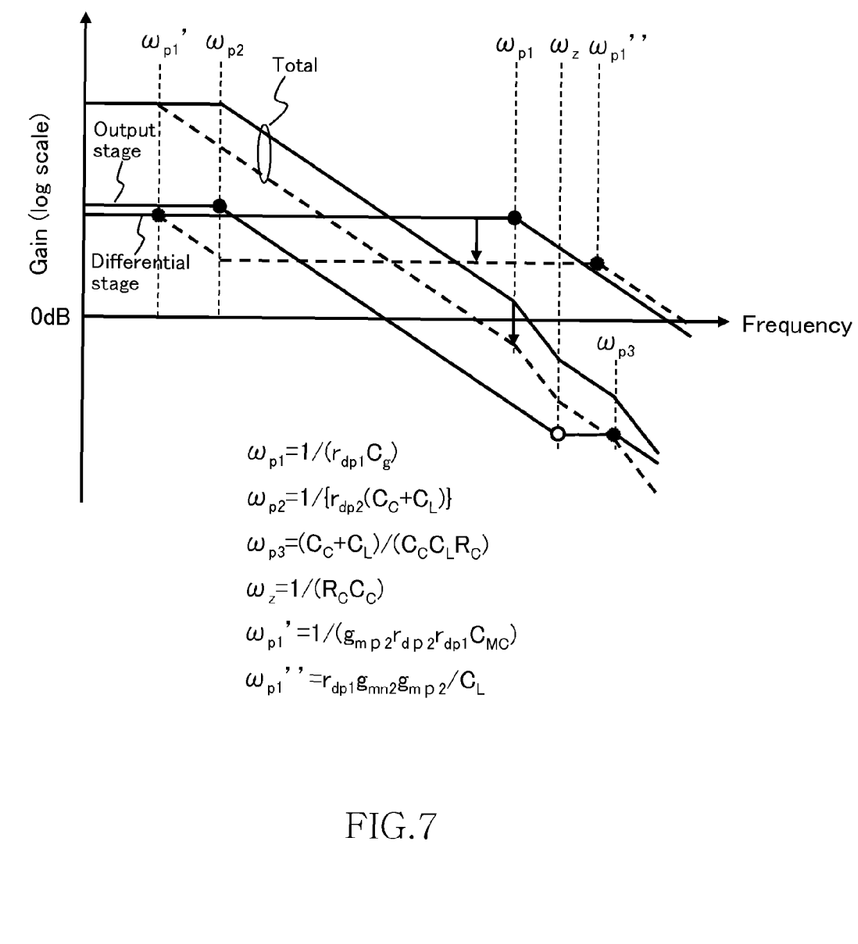
FIG. 7 is a gain diagram of the differential amplifier circuit shown in FIG. 6.

Turning to FIG. 7, the characteristics indicated by solid lines correspond to a differential stage gain, an output stage gain, and a total gain in the case where there is no phase compensation capacitance $C_{MC}$. The characteristics indicated by dashed lines correspond to a differential stage gain, an output stage gain, and a total gain in the case where the phase compensation capacitance $C_{MC}$ is inserted. Poles are indicated by black circles, and zero points by white circles.

Figure 8:
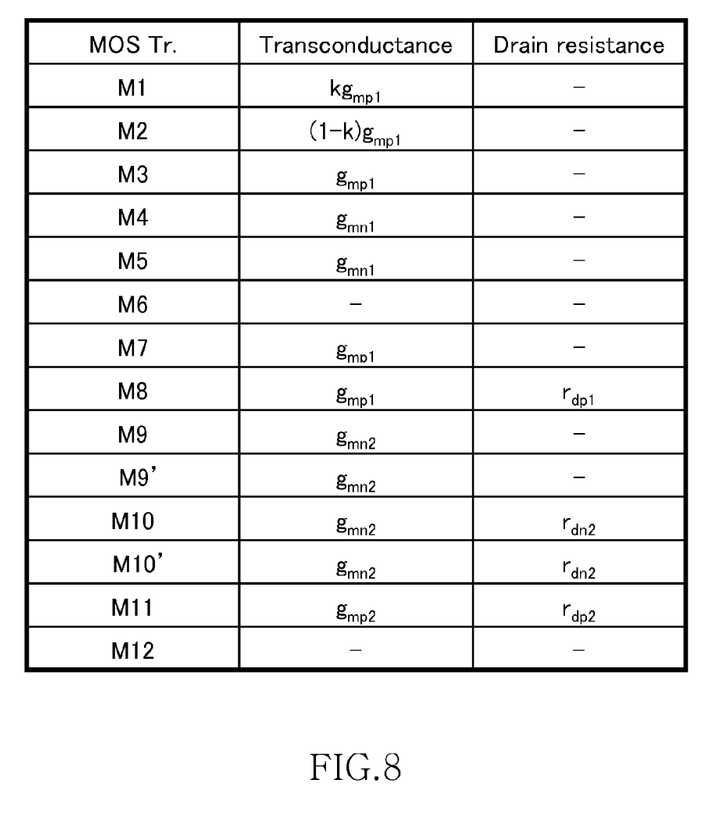
FIG. 8 is a table indicating the parameters used in the calculating formulae of FIG. 7.

Symbol $\omega_z$ shown in FIG. 7 is a zero point frequency caused by the resistance $R_C$ and capacitance $C_C$ that make up a phase compensation circuit of a pole-zero type. Symbol $\omega_{p1}$ is a pole frequency caused by the equivalent output resistance $r_{dp1}$ of the transistor M8 and the gate capacitance of the driver transistor M11. Symbol $\omega_{p2}$ is a pole frequency caused by load capacitance $C_L$, capacitance $C_C$, and the equivalent output resistance $r_{dp2}$ of the transistor M11. Symbol $\omega_{p3}$ is a pole frequency caused by load capacitance $C_L$, capacitance $C_C$, and resistance $R_C$. FIG. 7 also shows calculating formulae of the zero point frequency $\omega_z$ and pole frequencies $\omega_{p1}$, $\omega_{p2}$, and $\omega_{p3}$. Incidentally, the meanings of parameters used in the calculating formulae of FIG. 7 are described in FIG. 8.

The phase of the differential amplifier circuit is delayed by 90 degrees each time the phase passes through a pole frequency. The phase of the differential amplifier circuit is advanced by 90 degrees each time the phase passes through a zero point frequency. The stability of the feedback loop is determined based on a margin associated with a delay of 180 degrees in phase rotation angle at a frequency at which the total gain becomes 0 dB, i.e. phase margin. The required phase margin varies depending on the intended use. In general, in the case of an on-chip regulator, it is said that the phase margin needs to be 30 degrees or more.

As indicated by solid lines in FIG. 7, when there is not phase compensation capacitance $C_{MC}$, as the frequency is shifted from a low frequency side to a high frequency side, the total gain passes through the two pole frequencies $\omega_{p2}$ and $\omega_{p1}$ before reaching 0 dB, meaning that the phase is delayed by 180 degrees. In this case, suppose that the zero point frequency $\omega_z$ is slightly higher in frequency than the pole frequency $\omega_{p1}$; at a frequency at which the total gain becomes 0 dB, the phase is moved back slightly from 180 degrees, and is in a stable state. In this state, if the gain of the differential amplifier rises, the frequency at which the total gain becomes 0 dB is shifted further to the high frequency side, possibly resulting in a rise in the amount of phase shift and an increase in instability. Moreover, if the pole of the differential amplifier is shifted to the low frequency side, the frequency at which the total gain becomes 0 dB is shifted to the low frequency side, lowering a phase-advance effect associated with the zero point frequency $\omega_z$ and resulting in an increase in instability.

Incidentally, the above phenomenon becomes noticeable as the gain or a shift in pole frequency becomes several or more times larger, having a great impact on phase shift. The addition of the transistor M2 shown in FIGS. 4 to 6, and the cascode-connection of the current mirror circuits CM13a and CM13b shown in FIG. 6 bring about a significant change in a way that multiplies the gain or the pole frequency by about two to ten. Therefore, it is preferred that the value of 1/k be so designed as to be small, i.e., about two to four.

As shown in FIG. 7, if the phase compensation capacitance $C_{MC}$ is connected, the characteristics are changed to those indicated by dashed lines. That is, the phase compensation capacitance $C_{MC}$ divides the pole frequency $\omega_{p1}$ into a low frequency-side pole frequency $\omega_{p1}'$ and a high frequency-side pole frequency $\omega_{p1}''$, decreasing the gain between a low range and middle range of the differential stage (comparator). In this case, from a viewpoint of the output node N1, the capacitance value of the phase compensation capacitance $C_{MC}$ appears to become $g_{mn2} r_{dn2}^2$ times larger as in the case of the gain of the output stage. Therefore, because of the capacitance value of the phase compensation capacitance $C_{MC}$ and the output resistance $r_{dp1}$ of the differential stage, the pole frequency $\omega_{p1}$ is shifted to a lower pole frequency $\omega_{p1}'$. As a result, there is a decrease in the gain in the low frequency range of the differential stage. Meanwhile, the pole frequency $\omega_{p1}''$ becomes equivalent to the situation where the pole frequency $g_{mp2}/C_L$, which is made by the transconductance $g_{mp2}$ of the output stage and the load capacitance $C_L$, is amplified by the transistor M10' so as to be $r_{dp1} g_{mn2}$ times larger. Therefore, the pole frequency $\omega_{p1}''$ is shifted to a higher frequency side than the pole frequency $\omega_{p1}$.

At this time, other pole frequencies and zero point frequencies are the same as when there is no phase compensation capacitance $C_{MC}$. Therefore, the frequency at which the total gain becomes 0 dB becomes lower than the pole frequency $\omega_{p1}$, leading to an increase in stability. However, if the phase compensation capacitance $C_{MC}$ exists, the frequency at which the total gain becomes 0 dB is moved away from the zero point frequency $\omega_z$. Therefore, if the gain at the pole frequency $\omega_{p1}$ is not sufficiently lowered (e.g. less than or equal to $-10$ dB), the operation may be ineffective or help to increase instability. The preferred value of the phase compensation capacitance $C_{MC}$ varies according to the load capacitance $C_L$. Given the load capacitance $C_L$ of the internal voltage VPERI that is used in peripheral circuits of DRAM, the suitable value may be 1 to 5 pF. It can be said that the above value is far smaller compared with the case where the capacitance $C_C$ is about 1,000 pF.

Incidentally, the method of connecting the phase compensation capacitance $C_{MC}$ between the gate and drain of the driver transistor M11 may also be available. However, according to the above method, at a high frequency, the impedance of the phase compensation capacitance $C_{MC}$ decreases, becoming closer to the situation where the driver transistor M11 is diode-connected. In this situation, if the source potential of the driver transistor M11, i.e. the power-supply voltage VDD, is changed, the change is reflected directly in the internal voltage VPERI. On the other hand, in the differential amplifier circuit 70 shown in FIG. 6, the drain resistance of the transistor M10' is very high (about several hundred kilo-ohms). Therefore, even if the potential of the output node N1 is changed due to a change in VDD, most of the change is not propagated to the source of the transistor M10'. As a result, most of the change in the potential of the output node N1 is not propagated to the power-supply line L0, thereby decreasing the degradation of power supply rejection ratio (PSRR).

Incidentally, as for the phase compensation capacitance $C_{MC}$, unlike normal mirror compensation capacitance, non-polar capacitative elements are not necessarily used; MOS gate capacitance may be used. The reason is that the source potential of the transistor M10' is Vt+α≈0.7 V, and is lower than the level (1.0 V) of the internal voltage VPERI output. However, the difference between the source potential of the transistor M10' and the level of the internal voltage VPERI is about 0.3 V. Therefore, the gate capacitance of a MOS transistor of a low threshold voltage or of a depletion-type MOS transistor may be preferably used. The use of MOS gate capacitance is effective in logic LSI or the like in which a process of forming non-polar capacitance is not used.

Figure 9:
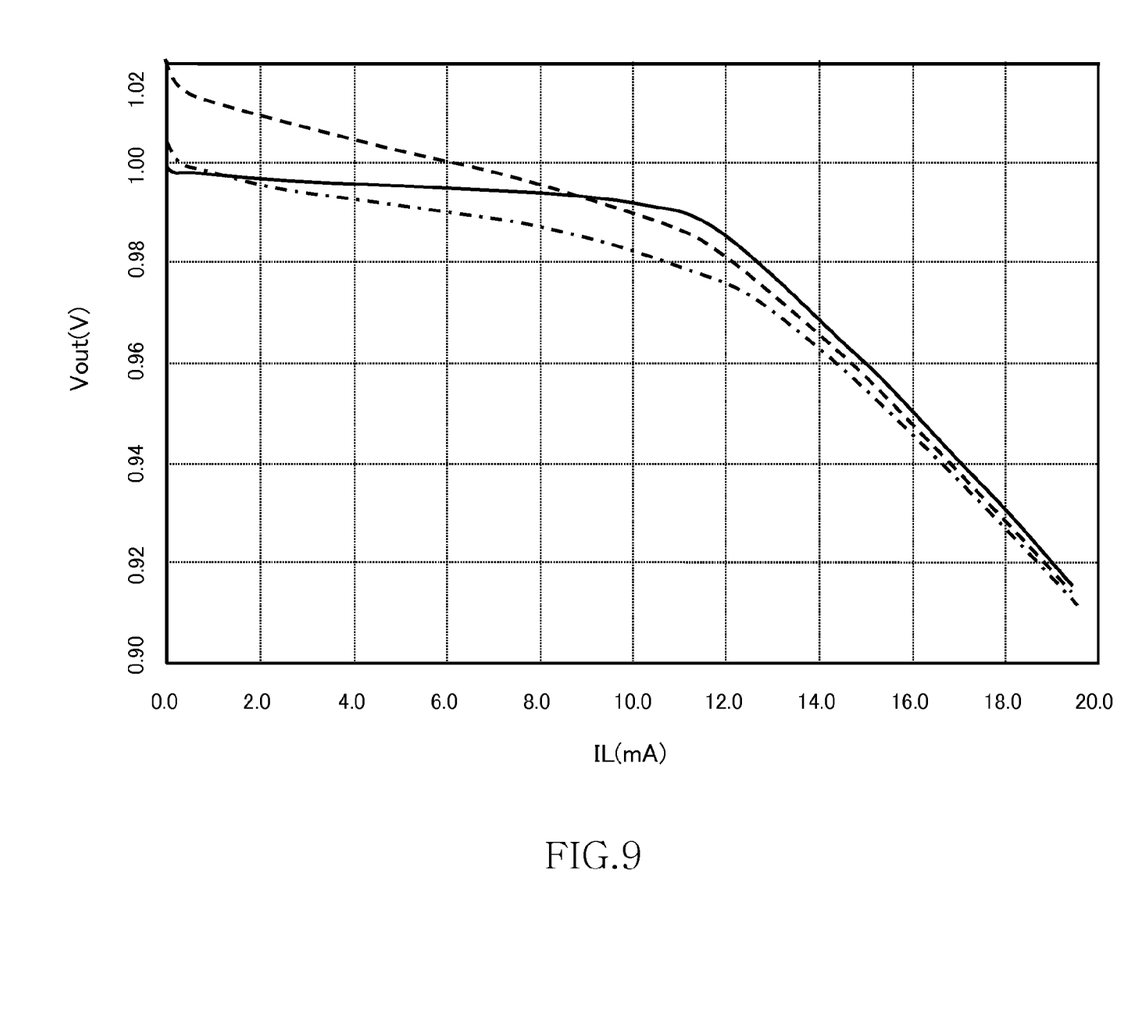
FIG. 9 is a graph showing load current-output voltage characteristics that are obtained by computer simulation in which element parameters of a 30 nm process are used.

Turning to FIG. 9, the solid line represents the characteristics of the differential amplifier circuit 70 of the third embodiment shown in FIG. 6. The dashed line represents the characteristics of the conventional differential amplifier circuit shown in FIG. 12. The alternate long and short dash line represents the characteristics of the case where the current mirror circuit CM3 is cascode-connected in the conventional differential amplifier circuit shown in FIG. 12.

As shown in FIG. 9, it is clear that the differential amplifier circuit 70 of the third embodiment is smaller in voltage error than the other differential amplifier circuits; and that the variation in the output voltage relative to the load current IL is also smaller. The above findings suggest that the gain of the differential amplifier circuit 70 of the third embodiment is higher than those of the other differential amplifier circuits.

Figure 10:
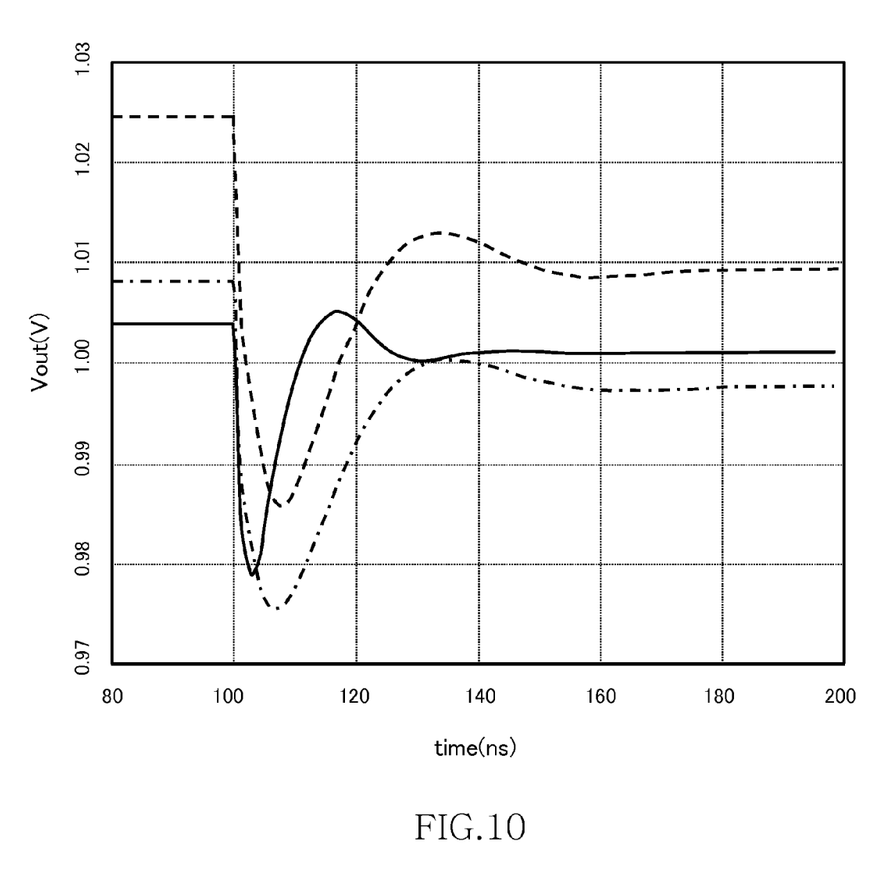
FIG. 10 is a graph showing transient response characteristics of output voltage at a time when a load current is changed that are obtained by computer simulation in which element parameters of a 30 nm process are used.

Turning to FIG. 10, the solid line represents the characteristics of the differential amplifier circuit 70 of the third embodiment shown in FIG. 6. The dashed line represents the characteristics of the conventional differential amplifier circuit shown in FIG. 12. The alternate long and short dash line represents the characteristics of the case where the current mirror circuit CM3 is cascode-connected in the conventional differential amplifier circuit shown in FIG. 12, and the phase compensation capacitance $C_{MC}$ is connected.

As shown in FIG. 10, it is clear that the differential amplifier circuit 70 of the third embodiment has a faster response speed than the other differential amplifier circuits. The reason is that the difference current generated by voltage variation is larger in the differential amplifier circuit 70 of the third embodiment. Moreover, the amount of ringing is smaller in the differential amplifier circuit 70 of the third embodiment than in the conventional differential amplifier circuit shown in FIG. 12. The smaller amount of ringing is considered to be attributable to the connection of the phase compensation capacitance $C_{MC}$. The characteristics indicated by the alternate long and short dash line are slightly better in stability than the characteristics of the differential amplifier circuit 70 indicated by the solid line. One possible reason is that the gain is low, and the effects of the phase compensation capacitance $C_{MC}$ are strongly expressed accordingly.

Figure 11:
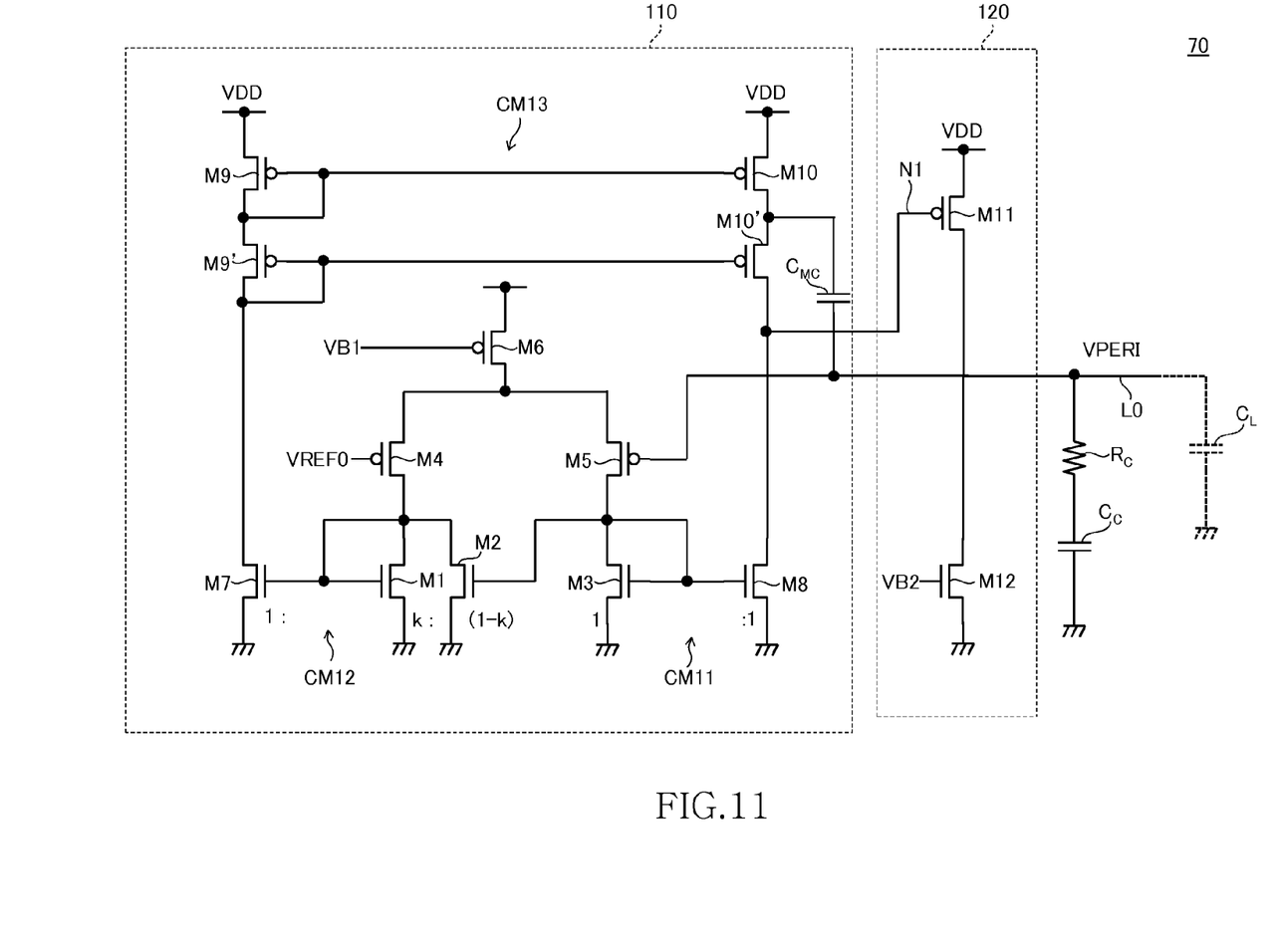
FIG. 11 is a circuit diagram of a differential amplifier circuit shown in FIG. 2 according to a fourth embodiment of the present invention.

In the above-described differential amplifier circuits 70 of the first to third embodiments, a pair of MOS transistors that are connected into a differential form is of a N-channel type. However, as in the case of a differential amplifier circuit 70 of a fourth embodiment shown in FIG. 11, the MOS transistors may be of a P-channel type. In the differential amplifier circuit 70 shown in FIG. 11, the conductivity types of transistors contained in the comparator 110 shown in FIG. 6 are all reversed. However, the connection relationship remains unchanged. In the differential amplifier circuit 70 shown in FIG. 11, a pair of MOS transistors that are connected into a differential form is of a P-channel type. Therefore, the differential amplifier circuit 70 shown in FIG. 11 is effective when the level of the internal voltage VPERI that should be generated is low (particularly when the level is less than or equal to VDD/2).

As described above, according to each of the above embodiments of the present invention, it is possible to provide a differential amplifier circuit that has a fast response speed and a small output voltage error, and a semiconductor device that includes the differential amplifier circuit.

It is apparent that the present invention is not limited to the above embodiments, but may be modified and changed without departing from the scope and spirit of the invention.

For example, in each of the above embodiments, MOS transistors are used to forma differential amplifier circuit. However, the type of transistors used are not limited to MOS transistors. Other types of transistors, such as bipolar transistors, may be used.

What is claimed is:

1. A device comprising:
   first and second input terminals;
   first and second power-supply terminals;
   a first current path including:
      a first node;
      a first transistor coupled between the first power-supply terminal and the first node and having a control electrode coupled to the first node; and
      a second transistor coupled between the second power-supply terminal and the first node and having a control electrode coupled to the first input terminal;
   a second current path including:
      a second node;
      a third transistor coupled between the first power-supply terminal and the second node and having a control electrode coupled to the second node;
      a fourth transistor coupled between the second power-supply terminal and the second node and having a control electrode coupled to the second input terminal; and
      a fifth transistor coupled between the first power-supply terminal and the second node and having a control electrode coupled to the first node; and
   a first current mirror circuit generating a first output current based on a first input current flowing through the first transistor;
   a second current mirror circuit generating a second output current based on a second input current flowing through the third transistor;

a third current mirror circuit generating a third output current based on one of the first and second output currents;

an output node through which a difference current between the other of the first and second output currents and the third output current flows; and a driver transistor coupled between the first and second power-supply terminals, the driver transistor having a control electrode coupled to the output node.

2. The device as claimed in claim 1, wherein a current ratio of the first input current and the first output current is substantially 1:1, and a current ratio of the second input current and the second output current is k:1, where k<1.

3. The device as claimed in claim 1, wherein the third current mirror circuit includes fourth and fifth current mirror circuits that are cascode-connected.

4. The device as claimed in claim 1, wherein one end of the driver transistor is coupled to the first power-supply terminal and the other end of the driver transistor is coupled to one of the first and second input terminals.

5. The device as claimed in claim 4, wherein the other of the first and second input terminals is supplied with a reference potential.

6. The device as claimed in claim 4, further comprising a first constant current source coupled between the other end of the driver transistor and the second power-supply terminal.

7. The device as claimed in claim 1, further comprising a second constant current source provided in common for the first and second current paths, the second constant current source being coupled between the second and fourth transistors and the second power-supply terminal.

8. The device as claimed in claim 1, wherein the first transistor has substantially the same in size as a sum of a size of the third and fifth transistors.

9. The device as claimed in claim 1, wherein the first, third, and fifth transistors are MOS transistors of a first conductivity type, and the second and fourth transistors are MOS transistors of a second conductivity type.

10. A device comprising:

first and second transistors coupled to form a differential circuit;

a first current mirror circuit generating first and second currents in response to a third current flowing through the first transistor;

a second current mirror circuit generating a fourth current in response to a fifth current, a sum of the second and fifth currents flowing through the second transistor; and a third current mirror circuit including an input node coupled to receive the fifth current and an output node coupled to receive the first current; and a driver transistor having a control electrode coupled to the output node.

11. The device as claimed in claim 10, wherein a current ratio of third and first currents is substantially 1:1, a current ratio of the third and second currents is 1:1-k, where k<1, and a current ratio of the fourth and fifth currents is substantially k:1.

12. The device as claimed in claim 11, wherein a current ratio of the one of the input and output nodes of the third current mirror circuit is substantially 1:1.

13. A method comprising:

generating first and second currents at a first current mirror circuit in response to a third current flowing through a first transistor coupled to a second transistor to form a differential circuit;

generating a fourth current at a second current mirror circuit in response to a fifth input current, where a sum of the second and fifth currents flow through the second transistor; and providing the fifth current to an input node of a third current mirror having an output node coupled to receive the first current, where the output node is coupled to a control electrode of a driver transistor.

14. The method of claim 13, wherein a current ratio of third and first currents is substantially 1:1, a current ratio of the third and second currents is 1:1-k, where k<1, and a current ratio of the fourth and fifth currents is substantially k:1.

15. The method of claim 14, wherein a current ratio of the one of the input and output nodes of the third current mirror circuit is substantially 1:1.

\* \* \* \* \*